United States Patent
Yaung et al.

[11] Patent Number: 6,165,880
[45] Date of Patent: Dec. 26, 2000

[54] DOUBLE SPACER TECHNOLOGY FOR MAKING SELF-ALIGNED CONTACTS (SAC) ON SEMICONDUCTOR INTEGRATED CIRCUITS

[75] Inventors: Dun-Nian Yaung, Taipei; Shou-Gwo Wuu, Hsinchu; Li-Chih Chao, Tao-yuan; Kuo Ching Huang, Kaohsiung, all of Taiwan

[73] Assignee: Taiwan Semiconductor Manufacturing Company, Hsin-Chu, Taiwan

[21] Appl. No.: 09/094,869

[22] Filed: Jun. 15, 1998

[51] Int. Cl.[7] .................................. H01L 21/4763
[52] U.S. Cl. ..................... 438/592; 438/624; 438/639; 438/672
[58] Field of Search ........................ 438/564, 622, 438/637, 639, 624, 649, 672, 684, 592; 257/758

[56] References Cited

U.S. PATENT DOCUMENTS

| | | | |
|---|---|---|---|
| 3,928,095 | 12/1975 | Harigaya et al. | 148/188 |
| 4,994,410 | 2/1991 | Sun et al. | 438/649 |
| 4,997,790 | 3/1991 | Woo et al. | 438/586 |
| 5,106,783 | 4/1992 | Chen et al. | 437/195 |
| 5,206,187 | 4/1993 | Doan et al. | 437/192 |
| 5,208,472 | 5/1993 | Su et al. | 257/344 |
| 5,364,804 | 11/1994 | Ho et al. | 437/41 |
| 5,378,654 | 1/1995 | Hsue | 437/195 |
| 5,439,846 | 8/1995 | Nguyen et al. | 437/187 |
| 5,578,524 | 11/1996 | Fukase et al. | 437/195 |
| 5,587,338 | 12/1996 | Tseng | 438/672 |
| 5,668,052 | 9/1997 | Matsumoto et al. | 438/624 |
| 5,719,071 | 2/1998 | Miller et al. | 438/612 |
| 5,786,276 | 7/1998 | Brooks et al. | 438/724 |
| 5,817,562 | 10/1998 | Chang et al. | 438/305 |
| 5,897,372 | 4/1999 | Howard | 438/637 |
| 5,902,132 | 5/1999 | Mitsuhashi | 438/666 |
| 5,914,518 | 6/1999 | Nguyen et al. | 257/377 |
| 5,926,728 | 7/1999 | Lee et al. | 438/586 |

Primary Examiner—Wael Fahmy
Assistant Examiner—Kurt Eaton
Attorney, Agent, or Firm—George O. Saile; Stephen B. Ackerman

[57] ABSTRACT

A method was achieved for making improved self-aligned contacts (SAC) to a patterned polysilicon layer, such as gate electrodes for FETs. Lightly doped source/drain areas are implanted. A second insulating layer is deposited and etched back to form first sidewall spacers. A silicon nitride etch-stop layer and a first interpolysilicon oxide (IPO1) layer are deposited. First SAC openings are etched in the IPO1 layer to the etch-stop layer, and concurrently openings are etched for the gate electrodes, eliminating a masking step. The etch-stop layer is etched in the SAC openings to form second sidewall spacers that protect the first sidewall spacers during BOE cleaning of the contacts. A patterned polycide layer is used to make SACs and electrical interconnections. A second IPO layer is deposited to provide insulation, and an interlevel dielectric layer is deposited. Second SAC openings are etched to the etch-stop layer for the next level of metal interconnections, while the contact openings to the gate electrodes are etched to completion. The etch-stop layer is etched in the second SAC openings to form second sidewall spacers to protect the first sidewall spacers during cleaning. Metal plugs are formed from a first metal in the second SAC openings and in the openings to the gate electrodes. A second metal is patterned to complete the structure to the first level of metal interconnections.

14 Claims, 8 Drawing Sheets

DOUBLE SPACER TECHNOLOGY FOR MAKING SELF-ALIGNED CONTACTS (SAC) ON SEMICONDUCTOR INTEGRATED CIRCUITS

BACKGROUND OF THE INVENTION (1) Field of the Invention

The present invention relates to the fabrication of integrated circuit devices on semiconductor substrates, and more particularly relates to a method for making more reliable self-aligned source/drain contacts for field effect transistors (FETs). A double-spacer technology is used in which second sidewall spacers are used to prevent damage to the first sidewall spacers thereby improving the electrical isolation between the self-aligned source/drain contacts and the polysilicon FET gate electrodes.

(2) Description of the Prior Art

One type of semiconductor device most commonly used for Ultra Large Scale Integration (ULSI) is the Field Effect Transistor (FET). These FET devices are fabricated by forming a polysilicon gate electrode having self-aligned source/drain contact (SAC) areas adjacent to the gate electrode, and are referred to as SAC-FETs. These SAC-FETs are preferred because of their small size, high packing density, low power consumption, and low manufacturing cost.

Conventional SAC-FETs are typically fabricated by patterning a stacked gate electrode layer comprised of a polysilicon layer and a silicon oxide ($SiO_2$) cap layer over a thin gate oxide on the device areas of a single crystal semiconductor substrate. The gate electrode structure is itself used as an implant barrier mask to form self-aligned lightly doped source/drain areas (LDD areas) in the substrate adjacent to the sides of the gate electrode. Insulating sidewall spacers, usually composed of $SiO_2$, are formed next and serve to mask the LDD areas, while the heavily doped source/drain contact areas are formed by ion implantation or at a later processing step by solid state diffusion form a doped polysilicon layer.

Unfortunately, several processing problems arise when these closely spaced SAC-FETs having sub-half-micrometer dimensions are fabricated. One problem occurs because much thinner $SiO_2$ sidewall spacers are used to achieve the higher device density. When the self-aligned contacts are etched in the overlying insulating layer to the source/drain areas, and a cleaning step is used to remove any remaining native oxide on the substrate, the thin oxide sidewall spacer is attacked resulting in electrical shorts between the SAC and FET gate electrode.

Several methods for making improved SAC-FETs have been reported in the literature. Matsumoto et al. in U.S. Pat. No. 5,668,052 teach a method for making improved self-aligned contacts (SAC) that avoids electrical shorts by using a second sidewall spacer formed from a silicon nitride etching stopper film. However, a reflection prevention film (anti-reflection coating) is used under the photoresist layer and is etched at the same time the silicon nitride sidewall spacers are formed. Matsumoto requires that the reflection prevention film and the etching stopper film be relatively thick and about equal in thickness. This limits the minimum spacing that can be achieved between closely spaced SAC-FETS. Also reported in the prior art of Matsumoto is a method in which a silicon nitride second sidewall spacer is used without an anti reflecting layer. However, neither Matsumoto or the prior art addresses the concurrent formation of the gate electrode contact that reduces process steps.

Fukase et al. in U.S. Pat. No. 5,208,472 teach a method of using a silicon rich oxide (SRO) layer as a second sidewall spacer to prevent shorts between the SAC and the gate electrode, and also teach the concurrent formation of a contact to the FET gate electrode. However, Fukase requires an additional masking and etch step. Another method of forming SAC-FETs is described by Hsue, U.S. Pat. No. 5,378,654, in which a single sidewall spacer is used. Su in U.S. Pat. No. 5,208,472 describes a method in which a dielectric layer is deposited and is anisotropically plasma etched to form a second sidewall spacer that reduces leakage current between source/drain and gate electrode. Ho in U.S. Pat. No. 5,364,804 describes a method for forming first sidewall spacers by thermal oxidation and then uses a second silicon nitride sidewall spacer to provide a better, more vertical sidewall for improved metal step coverage. Nguyen in U.S. Pat. No. 5,439,846 describes a method for forming a silicon nitride first sidewall spacer as an etch-stop layer on a gate electrode when etching self-aligned contact openings in an overlaying BPSG and an undoped silicon oxide glass. Chin et al., U.S. Pat. No. 5,106,783, describe a method for forming a bipolar transistor in which polysilicon emitter contacts are formed having oxide sidewalls. A second polysilicon layer is deposited and etched back to form self-aligned base contacts.

Therefore, there is still a strong need in the semiconductor industry to provide self-aligned contacts with improved electrical isolation between contacts and gate electrodes while reducing the number of process masking steps.

SUMMARY OF THE INVENTION

It is therefore a principal object of this invention to provide more reliable self-aligned contacts to a patterned first polysilicon layer, such as for FET gate electrodes on integrated circuits, and to concurrently form a contact to the FET gate electrode while eliminating an additional masking step.

A further object of this invention is to achieve these reliable self-aligned contacts using double-sidewall spacers.

Still another object of this invention is to provide a process flow that uses the double-sidewall spacers to form sequentially both polycide and metal self-aligned contacts that are more reliable and improve circuit density, which is a cost-effective and a very manufacturable process.

In summary, this invention provides a method for fabricating self-aligned source/drain contacts using double-sidewall spacers on patterned polysilicon, such as gate electrodes for field effect transistors (FETs). The method utilizes a silicon nitride etch-stop layer to which the self-aligned contact openings are etched. Then the silicon nitride is anisotropically etched in the contact openings to form second sidewall spacers. The second sidewall spacers prevent attack or damage to the oxide first sidewall spacers during cleaning, which improves the electrical isolation between the self-aligned contacts and the polysilicon gate electrodes. By forming the second sidewall spacers after etching the self-aligned source/drain contact openings, this method can be utilized in subsequent process steps to form other self-aligned contacts, such as metal contacts also having this improved electrical isolation.

The method for making these improved self-aligned contacts (SAC) begins by providing a semiconductor substrate having device areas. After forming a gate oxide on the device areas, a first polysilicon layer is deposited and a first insulating layer is deposited and patterned by photoresist masking and anisotropic plasma etching to form the gate electrodes with a cap oxide over the device areas and to form electrical interconnections elsewhere on the substrate. Lightly doped source/drain areas are implanted in the device areas adjacent to the gate electrodes, and a conformal second insulating layer, composed of silicon oxide, is deposited and blanket etched back to form silicon oxide first sidewall spacers on the gate electrodes. Now important to this invention, a conformal third insulating layer, composed of silicon nitride, is deposited as an etch-stop layer over the partially completed structure. A first interpolysilicon oxide (IPO1) layer is deposited and planarized using etch-back or chemical/mechanical polishing (CMP) means. First self-aligned contact openings are etched in the first IPO layer to the silicon nitride etch-stop layer. The first self-aligned contact openings are etched over the device areas adjacent to and extending over the gate electrodes. Concurrently first contact openings are etched over the gate electrodes to the etch-stop layer. Now, by the method of this invention The etch-stop layer is anisotropically plasma etched in the first self-aligned contact openings to the device areas. This forms second sidewall spacers from the etch-stop layer that protect the silicon oxide first sidewall spacers from erosion during cleaning, for example, when a buffer etch is used to remove any native oxide on the device areas in the first contact openings. Concurrently the etch-stop layer in the first contact openings over the gate electrodes is also removed. This eliminates the need for an additional masking step. After cleaning, a conductively doped second polysilicon layer is deposited followed by a refractory metal silicide deposition to form a polycide layer on the substrate. The polycide layer is then patterned, leaving portions over the first self-aligned contact openings to form the first of the self-aligned contacts, while also providing electrical interconnections elsewhere on the substrate.

Now continuing with the process flow, the invention can be used to make additional self-aligned contacts to the patterned first polysilicon layer, such as metal contacts for making the next level of integration. A second interpolysilicon oxide (IPO2) layer is deposited on the first IPO layer and over the polycide layer to electrically isolate the underlying structure (the polycide contacts and interconnections) and to provide for the next level of electrical interconnections. Then an interlevel dielectric (ILD) layer is deposited as the next level of insulation, and also extends over the second IPO layer. The second self-aligned contact openings are formed to the desired device areas. The second self-aligned contact openings are formed by photoresist masking and anisotropic etching the ILD layer, the second IPO layer, and the first IPO layer to the silicon nitride etch-stop layer. Then, similar to the etching of the first self-aligned contact openings, and by the method of this invention, the silicon nitride layer is anisotropically etched to form the second sidewall spacers. The cleaning process is now carried out without eroding the silicon oxide first sidewall spacers, thereby preventing damage to the first polysilicon. These second self-aligned contact openings also extend over the patterned first polysilicon layer similar to the first self-aligned contact openings. Concurrently the second contact openings are etched over the first contact openings and in the first insulating layer to the gate electrodes. A first metal layer, such as tungsten, is deposited and etched back to form metal plugs in the second self-aligned contact openings. The tungsten plugs are also formed in the second contact openings to the gate electrodes. This improved self-aligned contact structure is now completed up to the first level of metal interconnections by depositing and patterning a second metal layer, such as an aluminum/copper/silicon alloy.

BRIEF DESCRIPTION OF THE DRAWINGS

The objects and other advantages of this invention are best understood by the preferred embodiment with reference to the attached drawings which are now briefly described.

DESCRIPTION OF THE PREFERRED EMBODIMENT

The present invention is now described in detail for making more reliable self-aligned contacts (SAC) to a patterned polysilicon layer having a cap oxide, such as for self-aligned source/drain contacts to the gate electrodes of field effect transistors (FETs). The method uses a silicon nitride layer as an etch-stop layer and to form the second sidewall spacers of a double-sidewall spacer structure to prevent electrical shorting between the SACs and the polysilicon gate electrodes. The method also forms concurrently the contact to the gate electrodes without requiring an additional masking step, as required above in the prior of Fukase et al. A process flow is described for making both polysilicon and metal self-aligned contacts (SACs) sequentially. It should be understood by one skilled in the art that the method can be equally applied to forming self-aligned contacts to any electrically conducting lines on substrates, and indeed can be applied to making self-aligned contacts to both P-channel and N-channel FETs that are formed in P- and N-doped wells on the same substrate, thereby allowing for the fabrication of CMOS circuits using these improved SAC-FETs.

Figure 1:
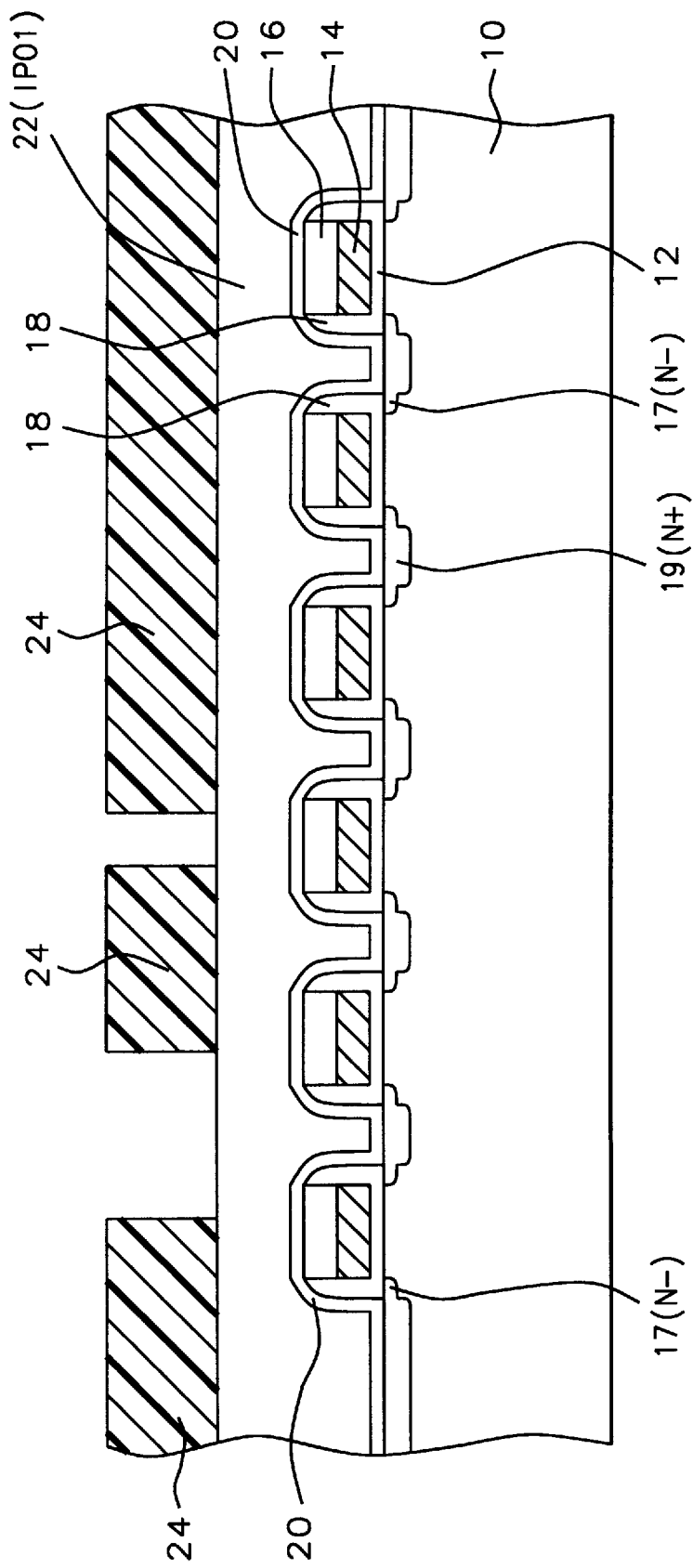
FIGS. 1–8 show schematic cross-sectional views for the sequence of process steps for making more reliable self-aligned source/drain contacts using double-sidewall spacers that prevent electrical shorts between the self-aligned contacts and a patterned first polysilicon layer, such as used for gate electrodes for FETS. The method also forms concurrently second self-aligned contacts to the gate electrodes.

Referring now to FIG. 1, a cross-section through a portion of a semiconductor substrate 10 is shown having a partially completed integrated circuit with closely spaced N-channel FETs. Preferably the substrate 10 is a P$^-$ doped single-crystal silicon having, for example, a <100> crystallographic orientation. In an effort to simplify the discussion and the drawings, the field oxide used to surround and electrically isolate the device areas is not shown and is not described. FIG. 1 shows a cross-section through several closely spaced FETs to which the improved double-sidewall, self-aligned contacts (SAC) are desired. The field effect transistors (FETs) are formed by growing a gate oxide 12. The gate oxide is typically formed by thermal oxidation and is grown to a thickness of between about 70 and 75 Angstroms. Next the FET gate electrodes having a cap oxide are formed. A polysilicon layer 14 is deposited using low-pressure chemical vapor deposition (LPCVD) and a reactant gas, such as silane (SiH$_4$). Layer 14 is doped with an N-type dopant by ion implantation with phosphorus ions (p$^{31}$) to a concentration of between about 1.0 E 19 and 1.0 E 21 atoms/cm$^3$, and is deposited to a thickness of about 1000 and 1500 Angstroms. A first insulating layer 16 is then deposited by LPCVD using tetraethosiloxane (TEOS) as the reactant gas, and is deposited to a preferred thickness of between about 1000 and 2000 Angstroms. Layers 16 and 14 are then patterned using a photoresist mask and anisotropic plasma etching to form the closely spaced gate electrodes having essentially vertical sidewalls. Next, to minimize the short channel effects in FETs with submicrometer (um) channels, lightly doped drains (LDD) 17(N$^-$) are formed adjacent to the gate electrodes 14 by ion implantation. For N-channel FETs the LDD ion implant is preferably arsenic ($As^{75}$) or phosphorus ($p^{31}$).

First sidewall spacers are formed next. A conformal second insulating layer 18, composed of silicon oxide ($SiO_2$), is deposited on the substrate and over the gate electrodes 14. For example, layer 18 is deposited by LPCVD using TEOS or TEOS/ozone ($O_3$), and is deposited to a thickness of between about 1000 and 1500 Angstroms. Layer 18 is then blanket etched back to form the first sidewall spacers 18 on the sidewalls of the gate electrodes 14, as shown in FIG. 1. The first sidewall spacers 18 for these submicrometer FETs are relatively thin to achieve high circuit density and are susceptible to damage during subsequent cleaning steps. Next, the source/drain contact areas 19($N^+$) are formed in the substrate using a second ion implantation.

Now important to this invention and still referring to FIG. 1, a conformal third insulating layer 20 is deposited-as an etch-stop layer over the partially completed structure. Layer 20 is preferably composed of silicon nitride ($Si_3N_4$), and is deposited by LPCVD using dichlorosilane ($SiCl_2H_2$) and ammonia ($NH_3$) as the reactant gases. The preferred thickness of layer 20 is between about 600 and 800 Angstroms. Next a first interpolysilicon oxide (IPO1) layer 22 is deposited over the $Si_3N_4$ layer 20. The IPO1 layer 22 is preferably composed of $SiO_2$ and is planarized using etch-back techniques or chemical/mechanical polishing, as is commonly practiced in the industry. Layer 22 is deposited and planarized to have a preferred thickness of between about 2500 and 3000 Angstroms over the FET gate electrodes. Alternatively, layer 22 can be a borophosphosilicate glass (BPSG), deposited by LPCVD using TEOS and appropriate boron (B) and phosphorus (P) dopant gases. The BPSG can then be planarized by leveling using thermal annealing. A photoresist layer 24 is patterned using conventional photolithographic techniques to form an etch mask having openings for etching the first self-aligned contact openings and concurrently for etching contact openings to the gate electrodes 14.

Figure 2:
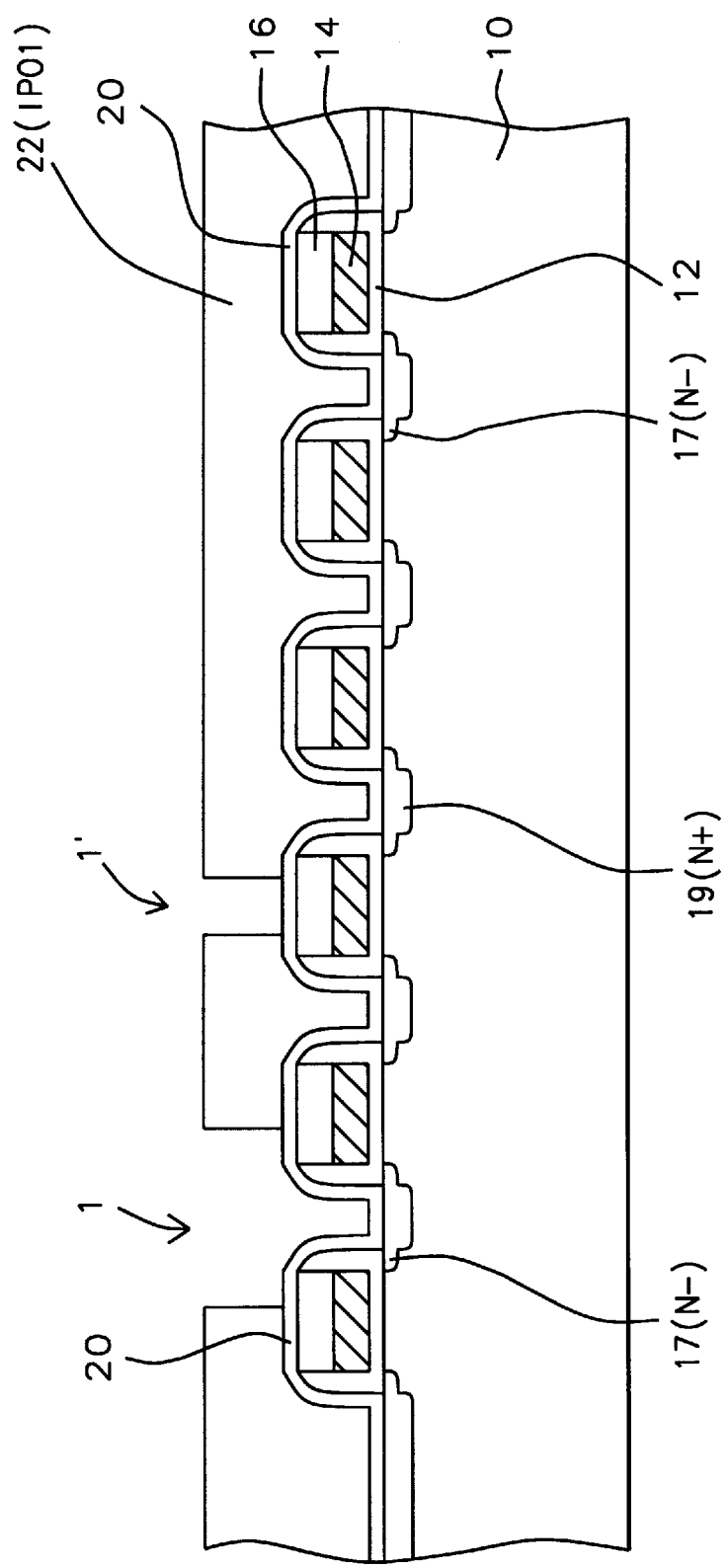

Referring now to FIG. 2, the photoresist mask 24 and anisotropic plasma etching are used to form openings 1 in the IPO1 layer 22 to the $Si_3N_4$ layer 20. These openings 1 extend over the gate electrodes 14. The etching is preferably carried out in a high-density plasma (HDP) etcher using a gas mixture of perfluoroisobutylene ($C_4F_8$) and a fluoromethane such as $CH_3F$ and etching parameters to achieve an etch-rate selectivity of $SiO_2$ to $Si_3N_4$ of at least 10:1. Concurrently first contact openings 1' are etched over the gate electrodes 14 to the etch-stop layer 20.

Figure 3:
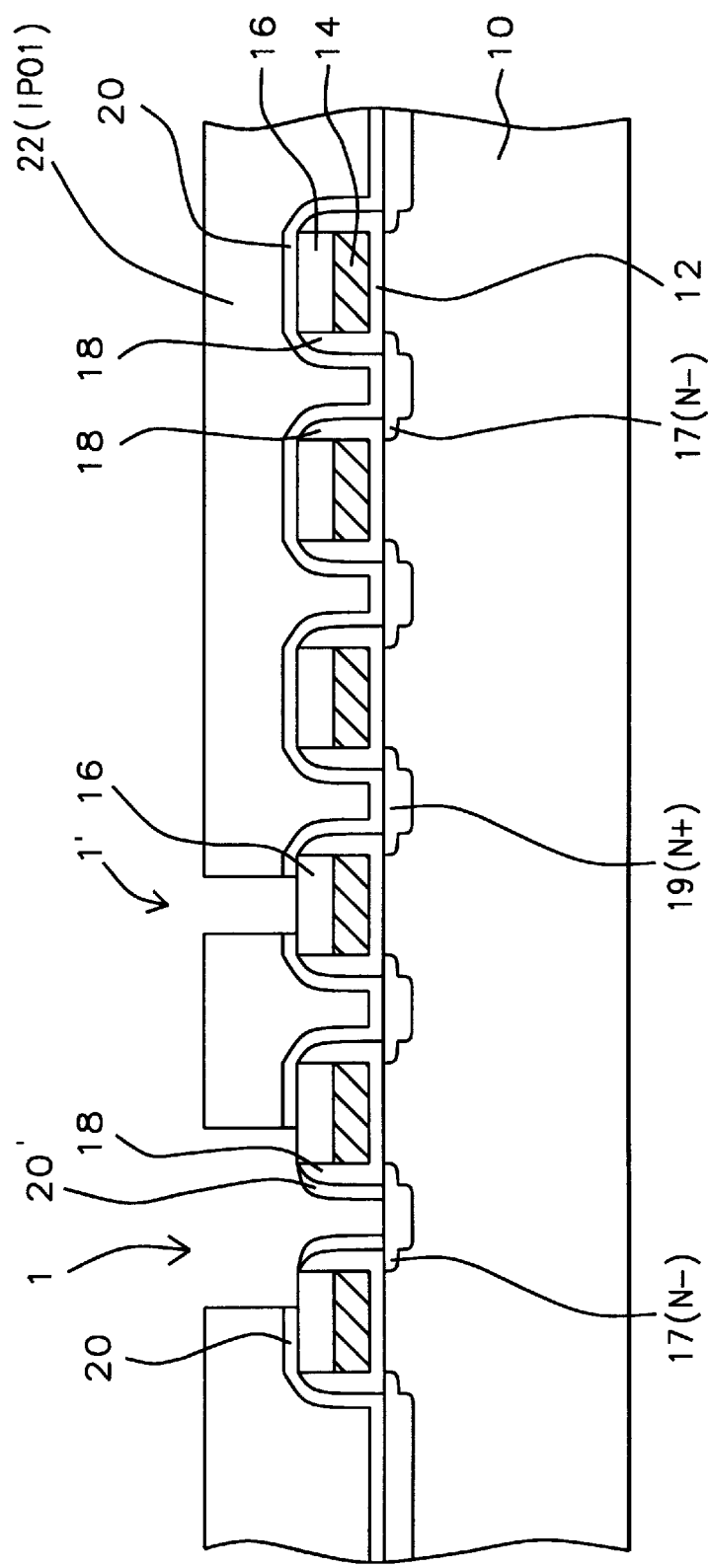

Referring next to FIG. 3 and by the method of this invention, the etch-stop layer 20 is anisotropically plasma etched in the first self-aligned contact openings 1 to the device areas on the substrate 10. Preferably the $Si_3N_4$ is anisotropically plasma etched in a HDP etcher using an etchant gas such as $C_4F_8$ and $CH_3F$ to selectively etch the $Si_3N_4$ to the silicon substrate 10. This forms second sidewall spacers 20' from the etch-stop layer 20 on the first sidewall spacers 18. Concurrently the etch-stop layer 20 is also etched in the first contact openings 1' to the first insulating layer 16 over the gate electrodes 14. Prior to forming the SAC in the first contact openings 1, a cleaning step is carried out to remove any native oxide formed on the device areas. For example, a buffered oxide etch (BOE), such as a dilute solution of hydrofluoric acid having a buffering agent such as ammonium fluoride ($NH_4F$), is used. The second sidewall spacers 20' protect the $SiO_2$ first sidewall spacers 18 from erosion during cleaning. Concurrently the etch-stop layer 20 in the first contact openings 1' over the gate electrodes 14 is also removed. This eliminates the need for an additional masking step, as is required in the prior art of Fukase et al. cited above.

Figure 4:
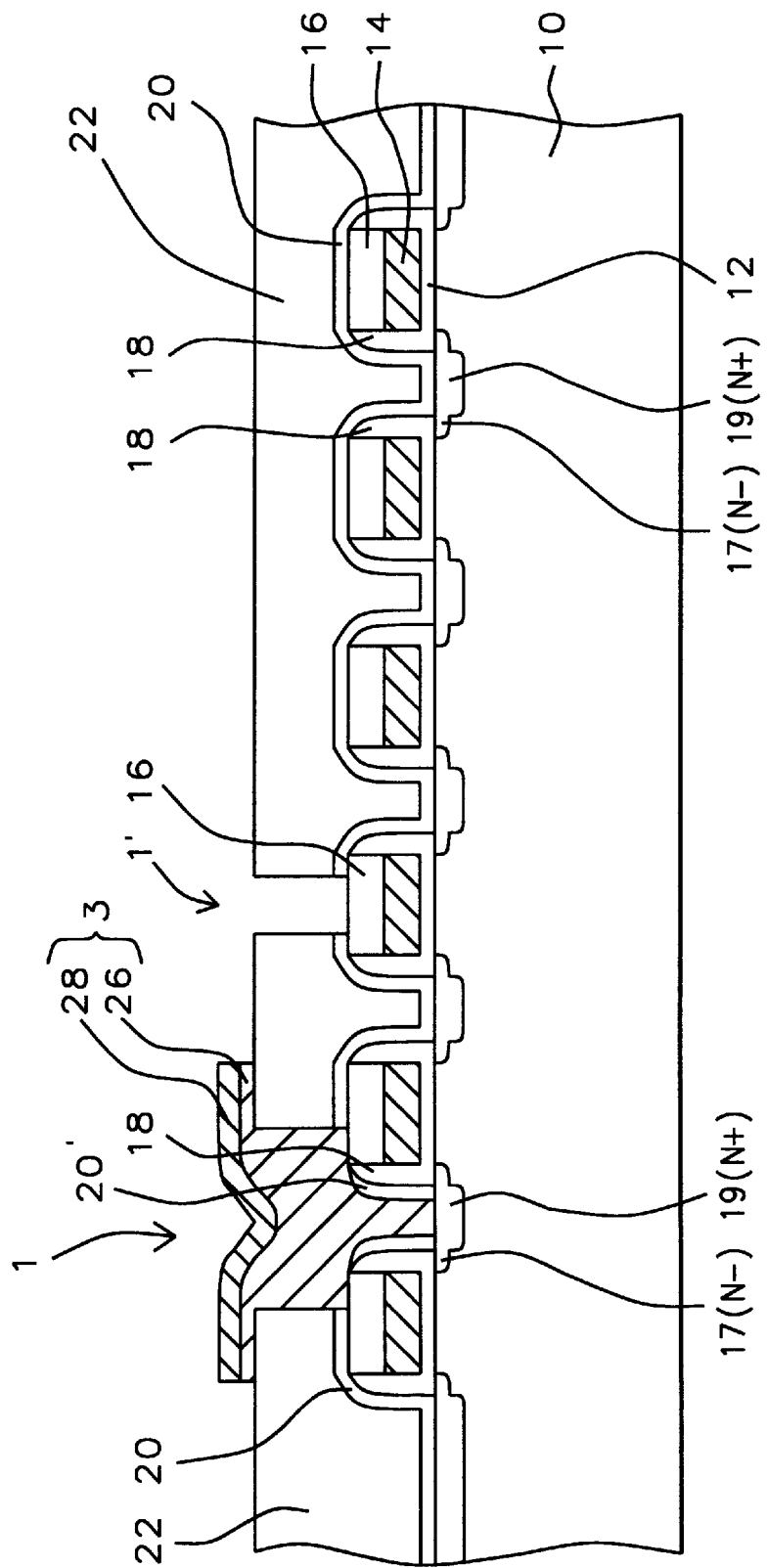

Referring now to FIG. 4, a conductively doped second polysilicon layer 26 is deposited followed by the deposition of a refractory metal silicide layer 28 to form a polycide layer on the substrate. Layer 26 is deposited by LPCVD using, for example $SiH_4$ as the reactant gas, and is preferably doped in situ during deposition by adding a dopant gas such as phosphine ($PH_3$) to a concentration of between about 1.0 E 19 and 1.0 E 21 atoms/$cm^3$. Layer 26 is deposited to a preferred thickness of between about 550 and 700 Angstroms. The silicide layer 28 is deposited next. Layer 28 is preferably tungsten silicide ($WSi_2$) and is deposited by CVD using tungsten hexafluoride ($WF_6$) and $SiH_4$ as the reactant gases. Layer 28 is deposited to a preferred thickness of between about 1000 and 1200 Angstroms. The polycide layer, composed of layers 26 and 28, is then patterned, leaving portions over the first self-aligned contact openings 1 to form the polysilicon first self-aligned contacts 3, while the polycide layer is also patterned to provide electrical interconnections elsewhere on the substrate.

Figure 5:
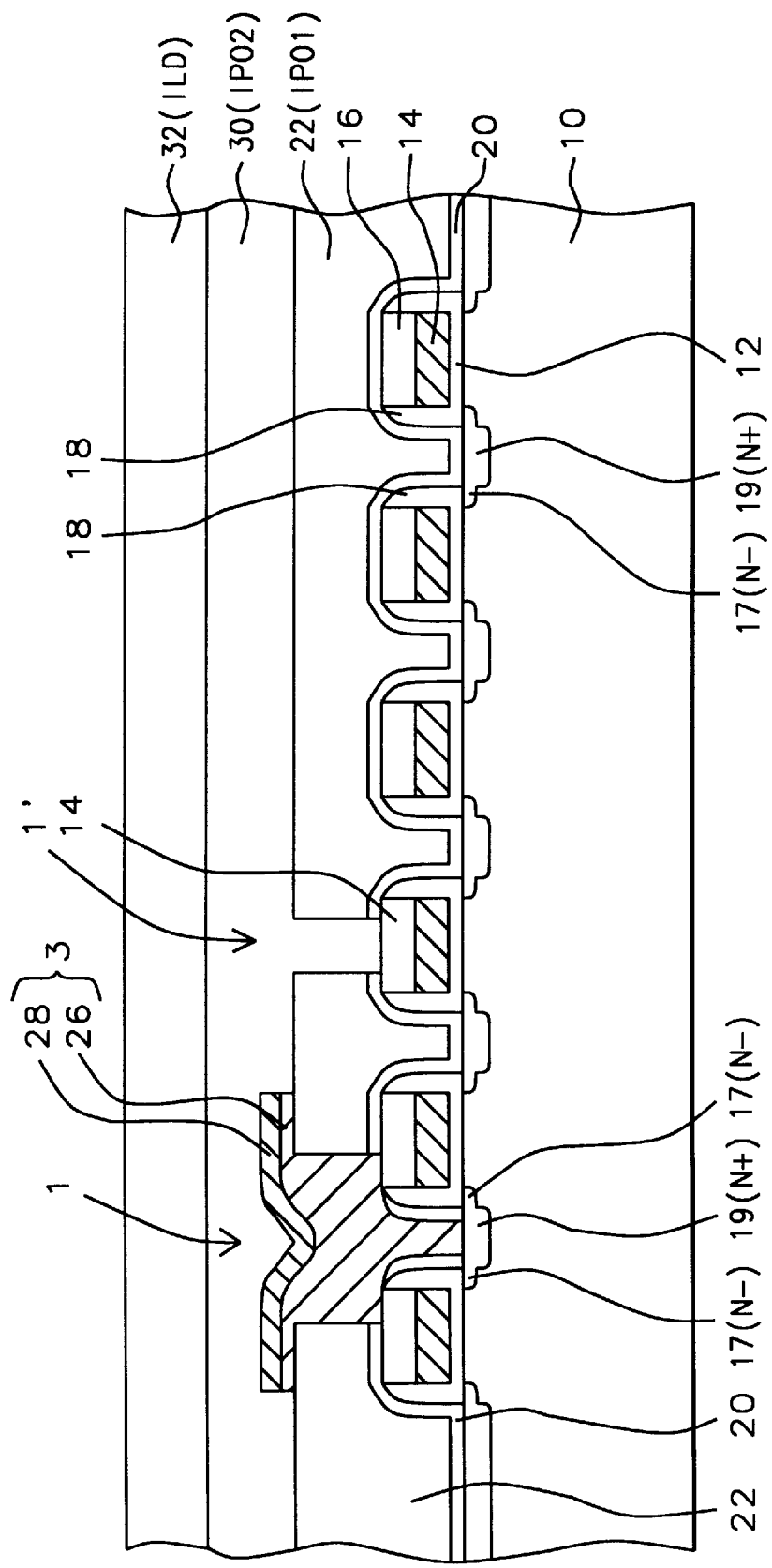

Referring to FIG. 5, and continuing with the process flow, the invention is used to make additional metal self-aligned contacts to the device areas and contacts to the patterned polysilicon layer 14 (for example, gate electrodes) for making the next level of metal interconnections. A second interpolysilicon oxide (IPO2) layer 30 is deposited on the first IPO layer 22 and over the patterned polycide layer 3, composed of layers 28 and 26, to electrically isolate the underlying structure. The second IPO (IPO2) 30 is deposited similar to the first IPO (IPO1) layer 22 by LPCVD and is deposited to a preferred thickness of between about 2500 and 3000 Angstroms. The process continues by depositing an interlevel dielectric (ILD) layer 32 is deposited as the next level of insulation. The ILD layer 32 is preferably $SiO_2$ and deposited by LPCVD using, for example, TEOS. The preferred thickness of layer 32 is between about 4000 and 6000 Angstroms.

Figure 6:
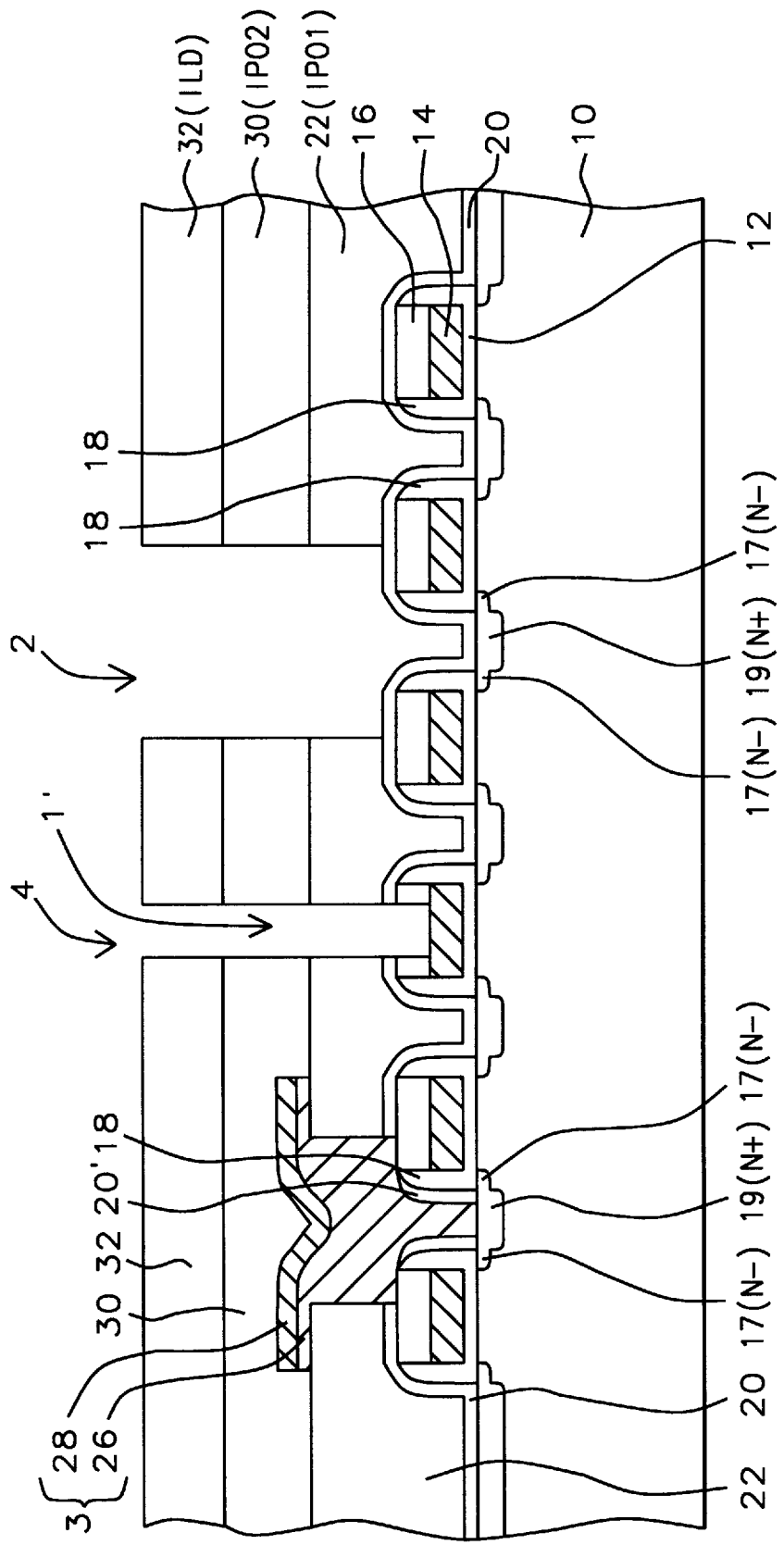

As shown now in FIG. 6, the second self-aligned contact openings 2 are formed to the desired device areas. The second self-aligned contact openings 2 are formed by photoresist masking and anisotropic etching the ILD layer 32, the second IPO layer 30, and the first IPO layer 22 to the silicon nitride etch-stop layer 20 over the source/drain contact areas 19($N^+$). The etching is preferably carried out using a HDP etcher and an etchant gas mixture of $C_4F_8$ and $CH_3F$ that selectively etches the $SiO_2$ to $Si_3N_4$ having an etch-rate ratio of at least 10:1. Concurrently second contact openings 4 are etched in the ILD layer 32, the IPO2 layer 30, and the IPO1 layer 22 over the first contact openings 1 and in the first insulating layer 16 to the gate electrodes 14.

Figure 7:
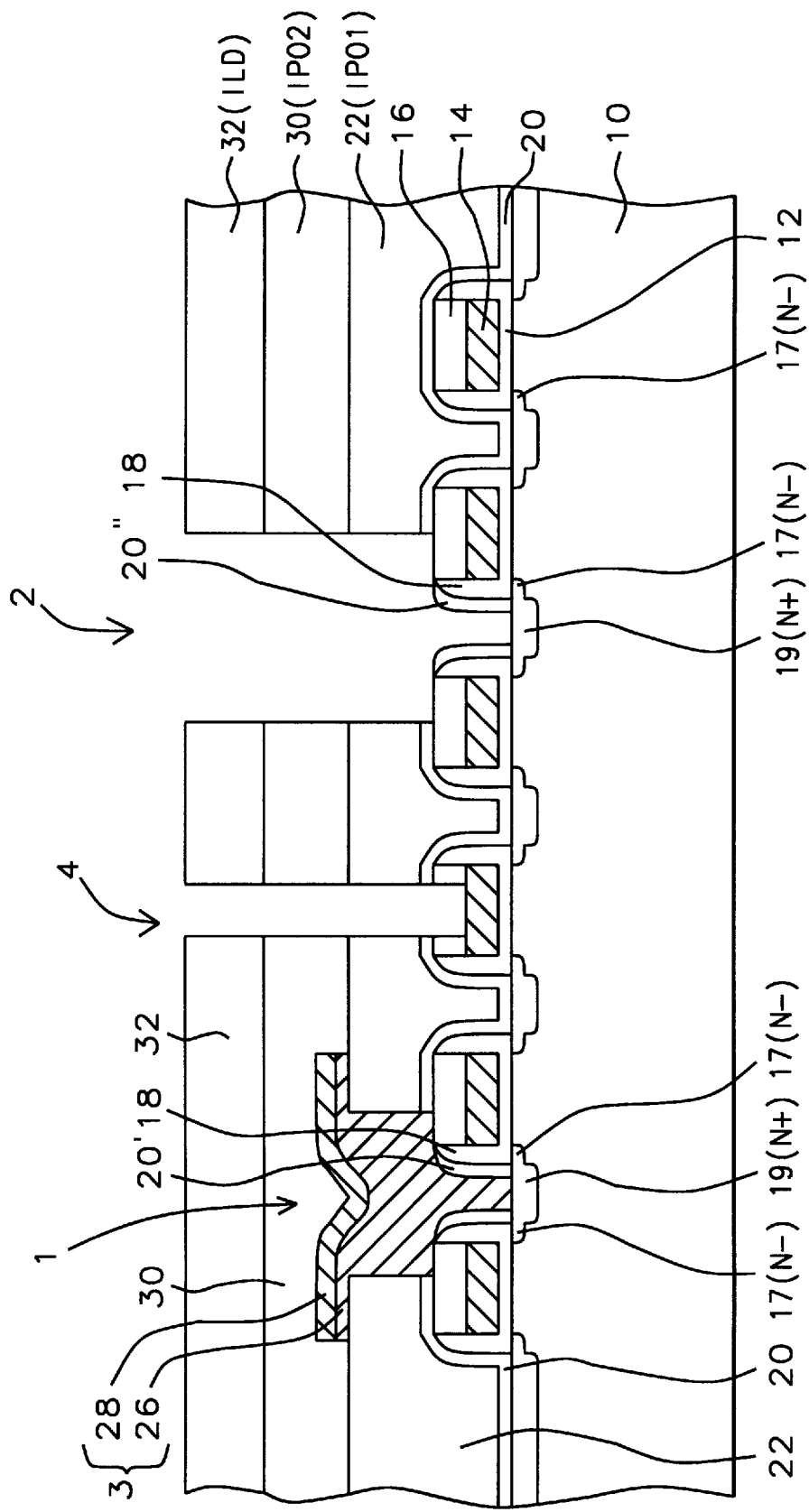

Referring to FIG. 7, the $Si_3N_4$ etch-stop layer 20 in the second self-aligned contact openings 2 is etched similar to the etching of the $Si_3N_4$ in the first self-aligned contact openings 1. And by the method of this invention, the $Si_3N_4$ layer 20 is anisotropically etched to form the second sidewall spacers 20". The cleaning process is now carried out. For example, a buffered oxide etch (BOE) is used to remove any native oxide on the source/drain contacts 19($N^+$) while the $Si_3N_4$ second sidewalls 20" protect the $SiO_2$ first sidewall spacers 18 from erosion, thereby preventing electrical shorts to the patterned first polysilicon layer 14, such as the gate electrodes 14.

Figure 8:
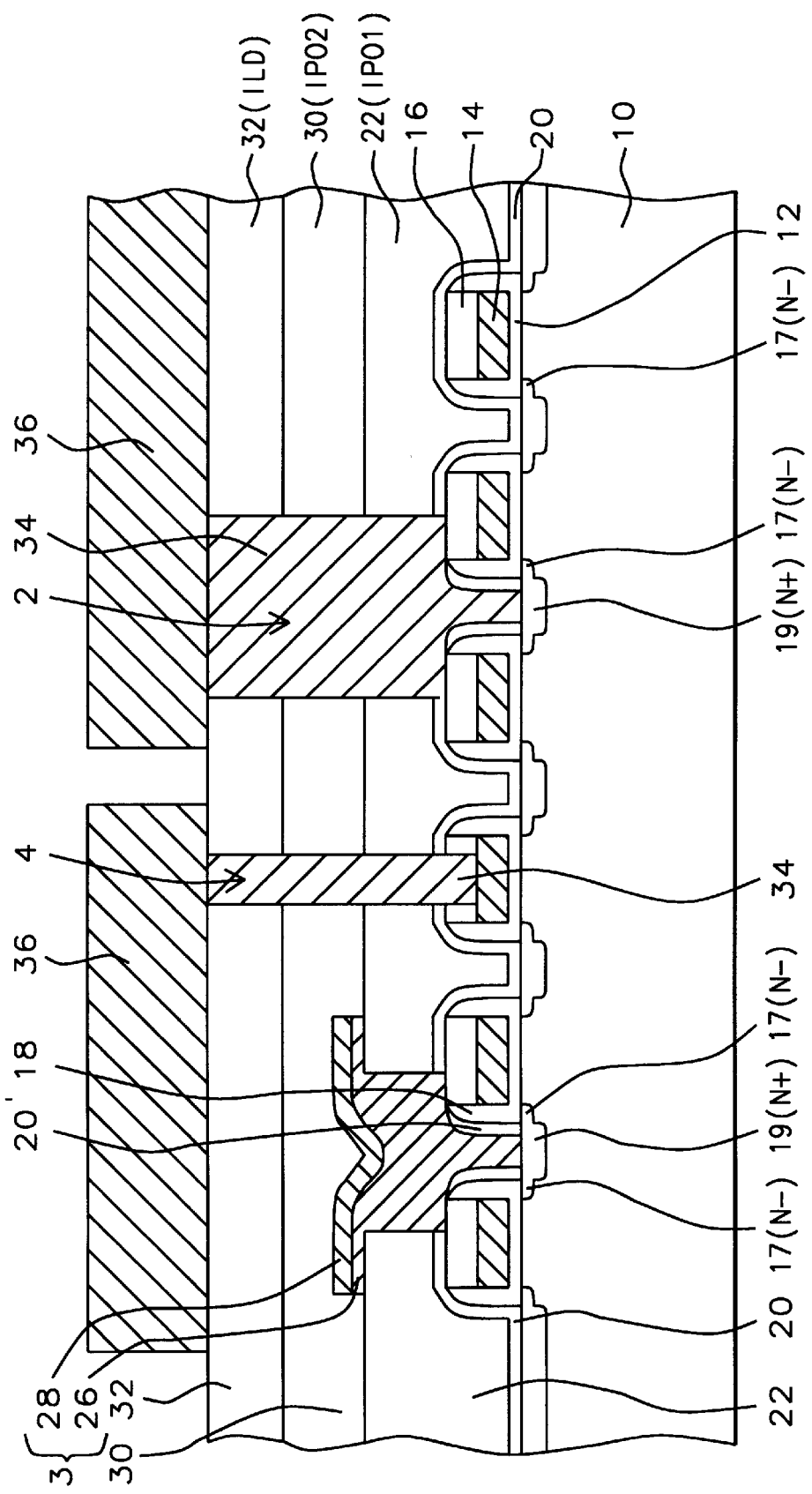

Referring to FIG. 8, a first metal layer 34 is deposited sufficiently thick to fill the second self-aligned contact openings 2, and concurrently to fill the contact openings 4 to the gate electrodes 14. Layer 34 is preferably composed of tungsten and is deposited by LPCVD using tungsten hexafluoride ($WF_6$) as the reactant gas. Layer 34 is then etched back or chemical/mechanically polished back to form tungsten plugs 34. This improved self-aligned contact structure is now completed to the first level of metal interconnections by depositing and patterning a second metal layer 36. Preferably layer 36 is an aluminum/copper/silicon alloy, deposited by physical vapor deposition (PVD). Layer 36 is deposited to a preferred thickness of between about 4000 and 5000 Angstroms. Layer 36 is then patterned using conventional photolithographic techniques and anisotropic plasma etching to provide the next level of electrical interconnections. Alternatively, the patterned layer 36 can be formed by other means such as by the Damascene process to provide copper interconnections.

While the invention has been particularly shown and described with reference to the preferred embodiment thereof, it will be understood by those skilled in the art that various changes in form and details may be made without departing from the spirit and scope of the invention.

What is claimed is:

1. A method for making improved self-aligned contacts (SAC) to a semiconductor substrate comprising the steps of:

providing said semiconductor substrate having device areas;

forming a gate oxide on said device areas;

depositing a first polysilicon layer on said device areas;

depositing a first insulating layer on said first polysilicon layer;

patterning by photoresist masking and anigotropic plasma etching said first insulating layer, and said first polysilicon layer, thereby forming gate electrodes having vertical sidewalls over said device areas;

forming lightly doped source/drain areas in said device areas adjacent to said gate electrodes;

depositing a conformal second insulating layer and blanket etching back to form first sidewall spacers on said gate electrodes;

depositing a conformal third insulating layer as an etch-stop layer on said device areas;

depositing and planarizing a first interpolysilicon oxide (IPO) layer;

forming first self-aligned contact openings in said first IPO layer to said etch-stop layer, where said first self-aligned contact openings are etched over said device areas adjacent to and extending over said gate electrodes to form first said self-aligned contact openings, and concurrently etching first openings in said IPO layer to said etch stop layer over said gate electrodes for making gate electrode contact openings;

anisotropically plasma etching said etch-stop layer in said first self-aligned contact openings to said device areas, and thereby forming second sidewall spacers from said etch-stop layer that protect said first sidewall spacers from erosion during buffer etching, and concurrently etching said etch-stop layer in said first contact openings over said gate electrodes;

removing native oxide from said device areas in said first self-aligned contact openings using said buffer etching;

depositing a conductively doped second polysilicon layer and a refractory metal silicide layer to form a polycide layer on said substrate;

patterning said polycide layer leaving portions over said first self-aliged contact openings to form first of said self-aligned contacts in said first self-aligned contact openings;

depositing a second interpolysilicon oxide (IPO) layer on said first IPO layer and over said polycide layer;

depositing an interlevel dielectric (ILD) layer on said second IPO layer;

forming second self-aligned contact openings in said ILD layer, said second IPO layer, and said first IPO layer to said etch-stop layer, where said second self-aligned contact openings are etched to said device areas adjacent to and extending over said gate electrodes to form said second self-aligned contact openings, and concurrently etching second contact openings over said first contact openings and etched in said first insulating layer to said gate electrodes;

anisotropically plasma etching said etch-stop layer in said second self-aligned contact openings to said device areas thereby forming second sidewall spacers from said etch-stop layer to protect said first sidewall spacers during a buffer-etcb cleaning;

removing native oxide from said devices areas in said second self-aligned contact openings using said buffer-etch cleaning;

depositing and etching back a first metal layer to form metal plugs in said second self-aligned contact openings and in said second contact openings over said gate electrodes to form said self-aligned contacts from said first metal layer;

depositing and patterning a second metal layer to form a first level of metal interconnections.

2. The method of claim 1, wherein said first polysilicon layer is conductively doped to a concentration of between about $1.0 \text{ E } 19$ and $1.0 \text{ E } 21$ atoms/cm$^3$ and is deposited to a thickness of between about 1000 and 1500 Angstroms.

3. The method of claim 1, wherein said first insulating layer is silicon oxide and is deposited to a thickness of between about 1000 and 2000 Angstroms.

4. The method of claim 1, wherein said first sidewall spacers are silicon oxide and have a width of between about 800 and 1000 Angstroms.

5. The method of claim 1, wherein said etch-stop layer is silicon nitride and is deposited to a thickness of between about 600 and 800 Angstroms.

6. The method of claim 1, wherein said first interpolysilicon oxide layer is silicon oxide and has a thickness after planarization of between about 2500 and 3000 Angstroms over said first insulating layer on said gate electrodes.

7. The method of claim 1, wherein said anisotropically plasma etching of said etch-stop layer is carried out using a high-density plasma etcher and resulting said second sidewall spacers have a width of between about 400 and 600 Angstroms.

8. The method of claim 1, wherein said second polysilicon layer is conductively doped to a concentration of between about $1.0 \text{ E } 19$ and $1.0 \text{ E } 21$ atoms/cm$^3$ and is deposited to a thickness of between about 500 and 700 Angstroms.

9. The method of claim 1, wherein said refractory metal silicide layer is tungsten silicide and has a thickness of between about 1000 and 1200 Angstroms.

10. The method of claim 1, wherein said device areas have heavily doped source/drain contacts formed by solid-state diffusion of said conductive dopant from said second polysilicon layer.

11. The method of claim 1, wherein said second interpolysilicon oxide is silicon oxide and has a thickness of between about 2500 and 3000 Angstroms.

12. The method of claim 1, wherein said interlevel dielectric layer is silicon oxide and is deposited to a thickness of between about 2500 and 3000 Angstroms.

13. The method of claim 1, wherein said first metal layer is tungsten.

14. The method of claim 1, wherein said second metal layer is composed of an aluminum/copper/silicon alloy and has a thickness of between about 4 000 and 8000 Angstroms.

* * * * *